United States Patent [19]
Takeuchi

[11] Patent Number: 6,118,178
[45] Date of Patent: Sep. 12, 2000

[54] CIRCUIT FILM UTILIZING A POWER SUPPLY AND GROUND CONNECTIONS

[75] Inventor: Hayato Takeuchi, Kanagawa, Japan

[73] Assignee: Sony Corporation, Tokyo, Japan

[21] Appl. No.: 09/227,126

[22] Filed: Jan. 7, 1999

[30] Foreign Application Priority Data

Jan. 9, 1998 [JP] Japan .................................. 10-002714

[51] Int. Cl.$^7$ .................................................. H01L 23/34
[52] U.S. Cl. ......................... 257/707; 257/692; 257/706; 257/710; 257/712; 257/713; 257/730
[58] Field of Search .................................. 257/673, 692, 257/693, 707, 737, 738, 787, 706, 710, 713, 712, 730; 438/15, 26, 118, 119, 122

[56] References Cited

U.S. PATENT DOCUMENTS

| | | | |
|---|---|---|---|
| 5,583,378 | 12/1996 | Marrs et al. | 257/710 |
| 5,668,405 | 9/1997 | Yamashita | 257/668 |
| 5,689,887 | 11/1997 | Urushima | 257/684 |
| 5,760,465 | 6/1998 | Alcoe et al. | 257/669 |
| 5,767,528 | 6/1998 | Sumi et al. | 257/48 |
| 5,777,386 | 7/1998 | Higashi et al. | 257/737 |
| 5,777,387 | 7/1998 | Yamashita et al. | 257/737 |
| 5,886,399 | 3/1999 | Ohsawa et al. | 257/668 |
| 5,895,965 | 4/1999 | Tanaka et al. | 257/668 |
| 5,945,741 | 8/1999 | Ohsawa et al. | 257/777 |
| 5,998,241 | 12/1999 | Niwa | 438/122 |
| 6,020,626 | 2/2000 | Ohsawa et al. | 257/668 |
| 6,020,637 | 2/2000 | Karnezos | 257/738 |

*Primary Examiner*—Olik Chaudhuri
*Assistant Examiner*—Alonzo Chambliss
*Attorney, Agent, or Firm*—Hill & Simpson

[57] ABSTRACT

In a semiconductor device constituted by a film circuit, a semiconductor element, a reinforcement plate adhered to the film circuit, for surrounding this semiconductor element, and also a heat sink adhered to this reinforcement plate, which are sealed by employing resin, a stray capacitance between power supply terminals (between power supply and ground) is increased so as to increase the noise withstanding characteristic. Both the reinforcement plate and the heat sink own conductivity characteristics, a wiring film on the ground side among wiring films of the film circuit is electrically connected to one of the reinforcement plate and the heat sink, and a wiring film on the power supply side among these wiring films is electrically connected to the other of these reinforcement plate and heat sink. The heat sink is connected to the wiring film via, for instance, a conductive ring.

5 Claims, 6 Drawing Sheets

CIRCUIT FILM UTILIZING A POWER SUPPLY AND GROUND CONNECTIONS

BACKGROUND OF THE INVENTION

The present invention generally relates to a semiconductor device, and more specifically to a semiconductor device, a method for manufacturing this semiconductor device, and an electronic appliance with employment of this semiconductor device comprised of a film circuit on which a plurality of wiring films are formed while using an insulating layer as a base, one end of the wiring films are used as semiconductor element-sided terminals to be connected to electrodes of a semiconductor element, and an external terminal is formed on the other end of the wiring film; a semiconductor element, the respective electrodes of which are connected to the semiconductor element-sided terminals of the wiring films; a reinforcement plate adhered to the film circuit, for surrounding the semiconductor element; and a heat sink adhered to the reinforcement plate; in which the reinforcement plate, the film circuit, and the semiconductor element are sealed with each other.

As a semiconductor device, there is such a semiconductor device that the respective electrodes of a semiconductor element are bonded to tip portions of the respective leads (wiring films) of a film circuit, a space between this semiconductor element and the film circuit is sealed by using resin, and a ring-shaped reinforcement plate for surrounding the semiconductor element is adhered to a rear surface of the film circuit.

Figure 1A:
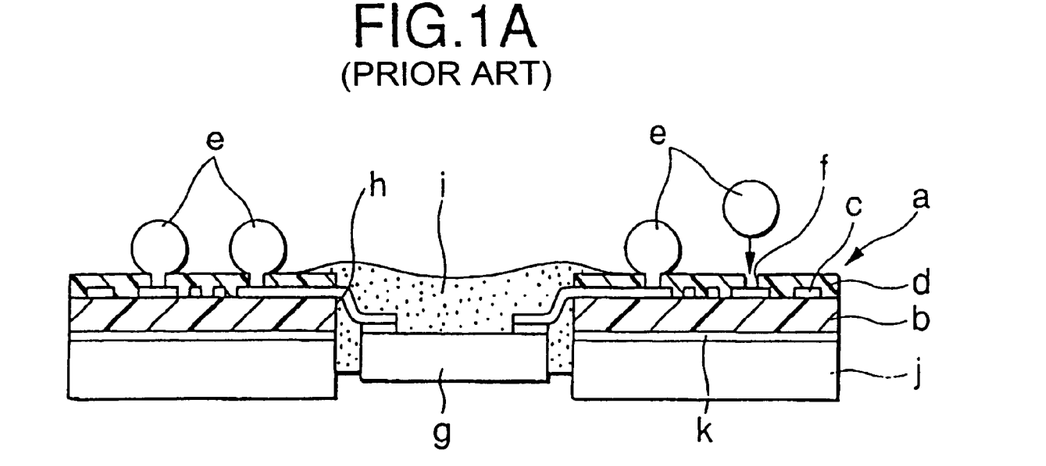
FIG. 1A and FIG. 1B are sectional views for representing the conventional semiconductor device.
Figure 1B:
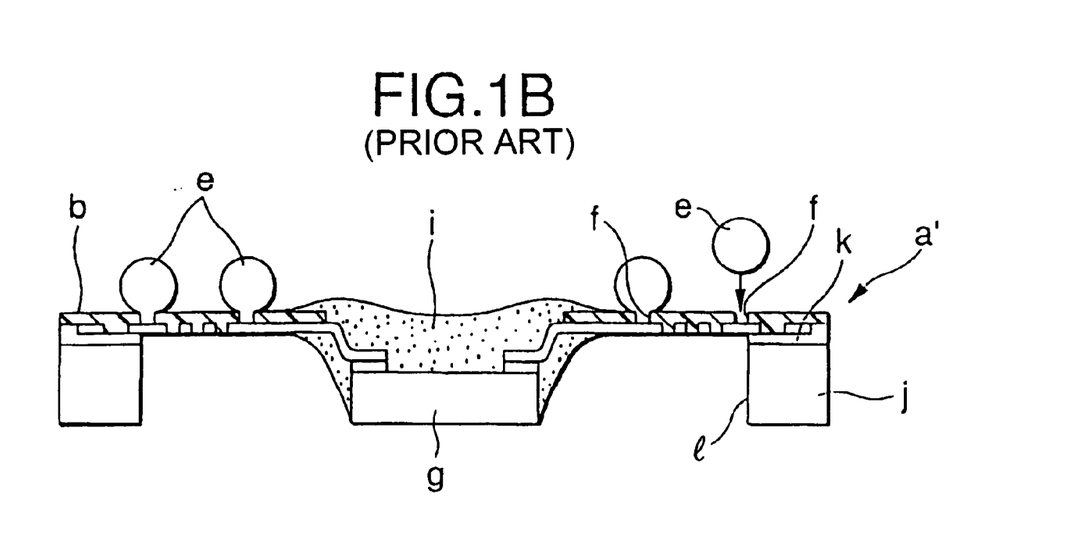

FIG. 1A and FIG. 1B are sectional views for indicating these conventional semiconductor devices. First, a description will now be made of the conventional semiconductor device shown in FIG. 1A. In this drawing, symbol "a" indicates a film circuit, symbol "b" shows a polyimide tape which may constitute a base of this film circuit, symbol "c" represents a wiring film which constitutes a lead, and symbol "d" shows an insulating layer for selectively covering a surface of the film circuit "a", which is located opposite to the base. This insulating layer is made of, for example, solder resist. Also, symbol "e" is a soldering ball formed in an opening "f" of the insulating layer "d", and this opening "f" exposes the surface of the lead "c". Also, this soldering ball constitutes an external terminal of the semiconductor device.

Symbol "g" indicates a semiconductor element, and an electrode of this semiconductor element "g" is bonded to a tip portion of such a portion projected into a device hall "h" of the lead "c". Symbol "i" indicates resin used to seal a space between the semiconductor element "g" and the film circuit "a". Symbol "j" represents a rectangular ring-shaped reinforcement plate. This reinforcement plate "j" is adhered via adhesive agent "k" to a position for surrounding the semiconductor element "g" of the rear surface of the film circuit "a".

Next, the conventional semiconductor device shown in FIG. 1B will now be explained. Symbol "a'" shows a film circuit constructed by a wiring film "c" which constitutes a lead that is formed on a rear surface of a polyimide tape "b" which constitutes a base of this film circuit. An opening "f" exposes the lead "c" formed in this polyimide tape "b", and a soldering ball "e" which constitutes an external terminal is formed in this opening "f". Similar to the semiconductor device shown in FIG. 5A, the semiconductor element "g" is connected to the lead "c" of the film circuit "a'", and a space between the semiconductor element "g" and the film circuit "a'" is sealed by using resin "i". Then, a rectangular ring-shaped reinforcement plate "j" is adhered via adhesive agent "k" to the rear surface of the film circuit "a'".

A description will now be made of an assembling method. First, the semiconductor element "g" is assembled on the film circuit a (a'). Next, the space between the film circuit a (a') and the semiconductor element "g" is sealed by using the resin "i". Thereafter, the reinforcement plate "j" is adhered to the rear surface of the film a (a'). Subsequently, the soldering ball "e" which constitutes the external terminal is formed.

On the other hand, according to the related art shown in FIG. 1A and FIG. 1B, no electric connection is made between the film circuit a (a') and the reinforcement plate "j". As a result, it is practically difficult to prevent the external noise from being entered. Also, a problem exists in that this conventional semiconductor device may not effectively prevent the external noise producing source.

Also, conventionally, after the semiconductor element "g" has been assembled to the film circuit a (a'), the space between the semiconductor element and the film circuit is sealed by using the resin. Thereafter, the reinforcement plate "j" is adhered to the film circuit a (a'). As a result, there is another problem that since the adhesive agent "i" is largely extruded, the reinforcement plate "j" can be hardly mounted. As a consequence, as indicated in FIG. 1B, such a plate having a large hole "l" must be employed as the reinforcement plate "j". However, this may cause the reinforcement effect to be deteriorated, resulting in an unfavorable effect. In other words, the reinforcement effect of the semiconductor device shown in FIG. 1B should be deteriorated.

To solve such a problem, the applicant has developed the following techniques as proposed Japanese Patent Application No. 8-54478 (which is laid-open in Japanese Unexamined Patent Application No. 9-246315). That is, the noise withstanding characteristics of the semiconductor device can be increased, and further the reinforcement plate can be mounted on the film circuit without problems. This proposed semiconductor device is featured by that the wiring film which constitutes the ground line formed on the peripheral portion thereof is provided on the film circuit, and the reinforcement plate owns the conductivity characteristics. Then, the wiring film which constitutes this ground line is electrically connected to this conductive reinforcement plate at the above-described peripheral portion of the film circuit. As a consequence, the reinforcement plate for surrounding the semiconductor element may be used as the ground line, namely may electrostatically shield other elements.

This semiconductor device may be manufactured as follows: The reinforcement plate is adhered to the film circuit. Thereafter, the semiconductor element is located at the position surrounded by the reinforcement plate, and the respective electrodes of this semiconductor element are bonded on the semiconductor element-sided terminal of the film circuit. Subsequently, the reinforcement plate, the film circuit, and the semiconductor element are sealed with each other. In other words, in accordance with such a semiconductor device manufacturing method, after the reinforcement plate has been adhered to the film circuit, the semiconductor element is assembled to the film circuit, and then is sealed. As a consequence, there is completely no risk that the sealing agent for sealing the space between the semiconductor element and the film circuit blocks adhesion of the reinforcement plate to the film circuit. As a consequence, the reinforcement plate can be mounted without any problem. Also, there is no need to employ such a reinforcement plate having the large hole as in the semiconductor device shown in FIG. 1B, taking account of the assembling condition. Accordingly, there is no risk that the reinforcement effect is deteriorated.

Figure 2A:
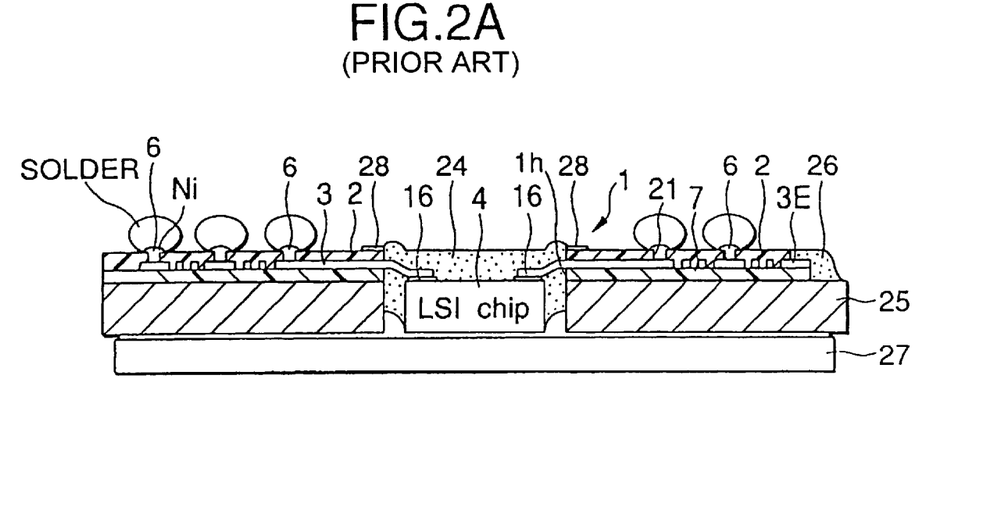
FIG. 2A is a sectional view for indicating another conventional semiconductor device.
Figure 2B:
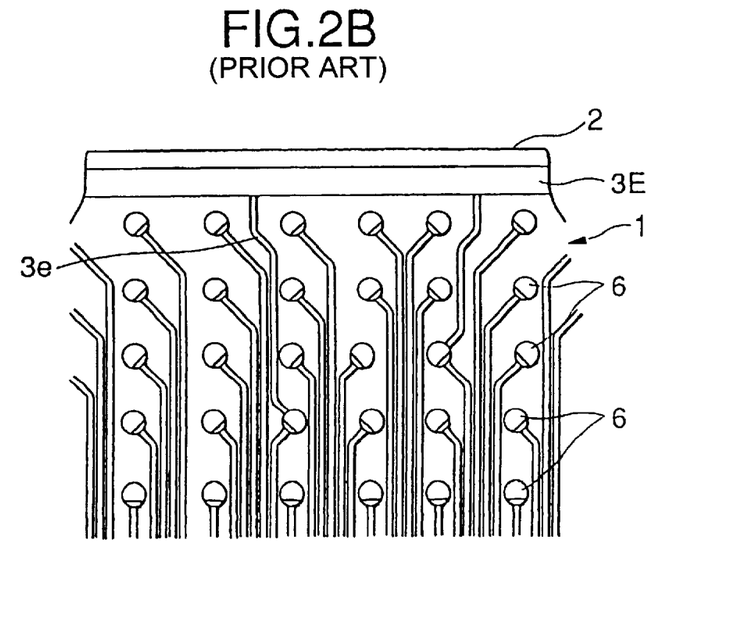
FIG. 2B is a plan view for showing a portion of this conventional semiconductor device.

FIG. 2A and FIG. 2B represent the above-described semiconductor device. This semiconductor device will now be simply explained. The wiring films 3E and 3e which constitute the ground line extended on the peripheral portion of the film circuit 1, and while using the conductive reinforcement plate 25, the wiring film which constitutes this ground line 3E is electrically connected to this conductive reinforcement plate 25 at the peripheral portion of the film circuit 1 by using, for example, conductive paste 26. The heat sink 27 is adhered to the rear surface of the film circuit 1 and the semiconductor element 4, if necessary.

Then, this semiconductor device is manufactured as follows. The reinforcement plate 25 is adhered to the film circuit 1. Thereafter, the semiconductor element 4 is located at the position surrounded by the reinforcement plate 25, and the respective electrodes of this semiconductor element 4 are bonded with the semiconductor element-sided terminals of the film circuit 1. Subsequently, the reinforcement plate 25, the film circuit 1, and the semiconductor element 4 are sealed with each other by using sealing agent 24. It should be understood that in the drawings, reference numeral 2 indicates an insulating film, reference numeral 3 denotes a wiring film (lead), reference numeral 6 shows an electrode of the semiconductor element 4, reference numeral 7 is elastic adhesive agent for adhering the conductive reinforcement plate 25 to the film circuit 1, reference numeral 16 indicates a bump of the wiring film (lead), and reference numeral 28 shows a dam for blocking a flow of the sealing resin 24 to the peripheral portion.

On the other hand, in accordance with the above-explained related art shown in FIG. 2A and FIG. 2B, the reinforcement plate can be surely used as the electrostatic shielding means, which may achieve the superior feature. However, there is a limit to suppress the noise generation. This is because the following limitation exists in increasing of the stray capacitance straying between the power supply line and the ground line (between power supply terminals, for example, between $V_{DD}$ and $V_{SS}$, or between $V_{CC}$ and $V_{EE}$). As a consequence, it is difficult to absorb the generated noise by the stray capacitance. This reason will now be described more in detail.

The level at the power supply terminal, and the ground level are varied due to the load variation and the like, which may directly cause the noise. Although this noise may be absorbed by the stray capacitance existing between the power supply and the ground, if this stray capacitance is small, then the noise cannot be sufficiently absorbed. As a consequence, the larger the stray capacitance between the power supply and the ground is increased, the better the noise absorption becomes. However, in accordance with the conventional semiconductor device shown in FIG. 2 FIG. 2A and FIG. 2B, this stray capacitance is constructed only of the stray capacitance between the power supply wiring film and the ground wiring film, and also of the stray capacitance between the reinforcement plate connected to the ground (or power supply) and the power supply wiring film (or ground wiring film).

SUMMARY OF THE INVENTION

The present invention has been made to solve such a problem, and therefore, has an object to increase a stray capacitance between power supply terminals (between power supply and ground) so as to increase a noise withstanding characteristic of a semiconductor device comprised of: a film circuit on which a plurality of wiring films are formed while using an insulating layer as a base, one ends of the wiring films are used as semiconductor element-sided terminals to be connected to electrodes of a semiconductor element, and an external terminal is formed on the other end of the wiring film; a semiconductor element, the respective electrodes of which are connected to the semiconductor element-sided terminals of the wiring films; a reinforcement plate adhered to the film circuit, for surrounding the semiconductor element; and a heat sink adhered to the reinforcement plate; in which the heat sink, the reinforcement plate, the film circuit, and the semiconductor element are sealed with each other.

To achieve the above-described object, a semiconductor device, according to a first aspect of the present invention, is featured by that both the reinforcement plate and the heat sink own conductivity characteristics; a ground terminal among the semiconductor element-sided terminals of the wiring film is also, electrically connected to one of the conductive reinforcement plate and the conductive heat sink; and a power supply terminal among the semiconductor element-sided terminals of the wiring film is also, electrically connected to the other of the conductive reinforcement plate and the conductive heat sink.

As a result, in accordance with the semiconductor device of the first aspect, since the ground terminal is connected to one of the conductive reinforcement plate and the conductive heat sink, and also the power supply terminal is connected to the other thereof, the stray capacitance straying between the reinforcement plate and the heat sink may also stray between the power supply line and the ground line. As a consequence, the stray capacitance straying between the power supply and the ground is increased, so that the noise can be effectively absorbed.

A method for manufacturing a semiconductor device, according to a second aspect of the present invention, is featured by that in a method for manufacturing the above-described semiconductor device as described in the first aspect, after the conductive reinforcement plate has been adhered to the film circuit, the semiconductor element is located to a position surrounded by the reinforcement plate and the respective semiconductor element-sided terminals of the wiring films of the film circuit are bonded with the respective electrodes of the semiconductor element; and at the same time, the ground terminal among the semiconductor element-sided terminals is also bonded on one of the conductive reinforcement plate and the conductive heat sink, and further the power supply terminal is also bonded on the other of the conductive reinforcement plate and the conductive heat sink; and thereafter, the conductive heat sink, the conductive reinforcement plate, the film circuit, and the semiconductor element are sealed with each other by using resin.

As a result, in accordance with the method for manufacturing the semiconductor device of the second aspect, since the power supply terminal of the wiring film of the film circuit and the ground terminal thereof are connected not only to the electrodes of the semiconductor element, but also to either the reinforcement plate, or the heat sink (double-bonding), the capacitance straying between the reinforcement plate and the heat sink can exist between the power supply terminal and the ground terminal.

An electronic appliance, according to a third aspect of the present invention, is featured by comprising the semiconductor device as recited in the first aspect.

As a result, in accordance with the electronic appliance of the third aspect, since the semiconductor device of the first aspect is used, the noise can be reduced.

In a semiconductor device of the present invention, a ground terminal may be connected to a reinforcement plate and a power supply terminal may be connected to a heat sink. Conversely, the ground terminal may be connected to the heat sink, and the power supply terminal may be connected to the reinforcement plate.

BRIEF DESCRIPTION OF THE DRAWINGS

For a better understanding of the present invention, reference is made of a detailed description to be read in conjunction with the accompanying drawings, in which:

FIG. 4A to FIG. 4I are sectional views for indicating sequential steps for forming the film circuit of the semiconductor device shown in FIG. 3, and also for assembling the reinforcement plate;

FIG. 5A to FIG. 5C are sectional views for indicating the completion of the semiconductor device such as assembling of the semiconductor element to the film circuit equipped with the reinforcement plate of the semiconductor device indicated in FIG. 3.

DETAILED DESCRIPTION OF THE PREFERRED EMBODIMENTS

Figure 3:
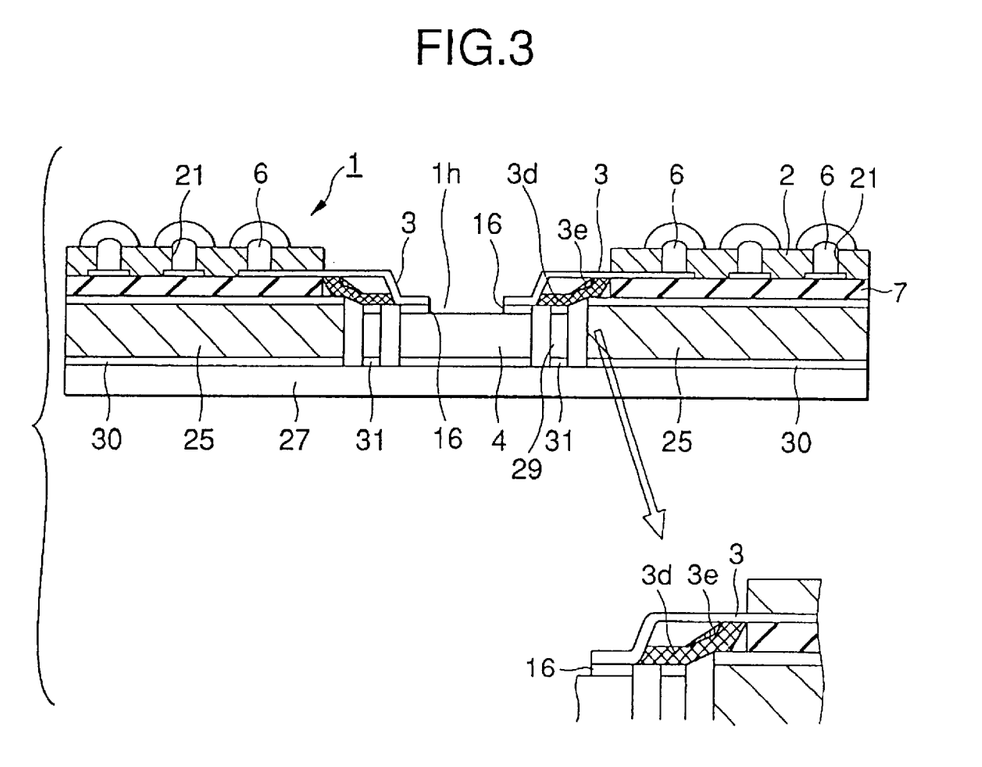
FIG. 3 is a sectional view for showing a semiconductor device according to a first embodiment of the present invention.

Referring now to drawings, the present invention will be described in conjunction with embodiment modes shown in these drawings. FIG. 3 is a sectional view for showing a semiconductor device according to a first embodiment of the present invention.

In the drawing, reference numeral 1 shows a film circuit. A large number of wiring films 3 which constitute leads are formed on the side of a rear surface of an insulating layer 2. Reference numeral 3e indicates a wiring film (lead) which constitutes a ground line connected to a ground electrode of a semiconductor element 4 (will be explained later) among the wiring films 3. Reference numeral 3d similarly shows a wiring film (lead) which constitutes a power supply line connected to an electrode of a power supply terminal. The inner edges of the respective wiring films 3, 3e, 3d are projected into a device hole 1h of an insulating layer 2, and constitute connection terminals to be connected to electrodes of the semiconductor element 4. For the sake of easy understanding, in FIG. 3, the wiring film (lead) 3d which constitutes the power supply line is indicated by a hatching of an inclined lattice, whereas the wiring film 3e which constitutes the ground line is painted in black. Reference numeral 6 shows a ball electrode 6 is formed on the insulating layer 2 and is formed in an opening 21 which exposes the lead 3 by way of the plating. This ball electrode 6 has a two layer structure made of, for instance, nickel and either solder or gold.

Reference numeral 25 is a rectangular ring-shaped reinforcement plate made of, for example, aluminum. The rectangular ring-shaped reinforcement plate 25 is adhered to the rear surface of the film circuit 1 via elastic adhesive agent 7. This reinforcement plate 25 is manufactured in such a manner that at least a portion of this reinforcement plate 25 is sticking out from the film circuit 1. Then, a portion deviated from the inner edges of the respective wiring films 3d which constitute the above-described ground line is bonded to an upper surface of this stick-out portion, so that the wiring films 3d are under connection condition to the reinforcement plate 25.

Reference numeral 29 is a rectangular conductive ring made of a conductive material. The rectangular conductive ring 29 is positioned apart from the reinforcement plate in such a manner that this rectangular conductive ring 29 is not made in contact with the inside of the reinforcement plate 25. A portion deviated from the inner edge of the wiring film 3d which constitutes the power supply line is bonded to an upper surface inner peripheral portion of this conductive ring 29.

Reference numeral 4 is a semiconductor element whose electrodes are bonded to bumps 16 of tip portions of the wiring films 3, 3d, 3e. Reference numeral 27 is a heat sink which is adhered to the semiconductor element 4, the reinforcement plate 25, and the rear surface of the conductive ring 29. The heat sink 27 is made of, for example, aluminum. This heat sink 27 is adhered to the reinforcement plate 25 via insulating adhesive agent 30, so that this heat sink 27 is electrically insulated from the reinforcement plate 25. To the contrary, the heat sink 27 is adhered to the conductive ring 29 via conductive adhesive agent 31. This heat sink 27 is electrically connected via the conductive ring 29 to the wiring film 3e which constitutes the ground line of the film circuit 1.

It should be noted that although the semiconductor element 4, the film circuit 1, the reinforcement plate 25, the heat sink 27, and the conductive ring 29 are sealed with each other by using resin, the sealing resin is not shown in this drawing. On the other hand, in such a case that the potential at the rear surface of the element may become equal to the power supply level, the semiconductor element 4 may be adhered to the heat sink 27 by using the conductive adhesive agent. To the contrary, when the potential at the rear surface of the element is not equal to the power supply level, the semiconductor element 4 must be adhered to the heat sink 27 by employing the insulating adhesive agent. However, this never constitutes the essential subject of the present invention.

In such a semiconductor device, the reinforcement plate 25 for surrounding the semiconductor element 4 may be used as the power supply line, and also the heat sink 27 may be employed as the ground line. Both the reinforcement plate 25 and the heat sink 27 can electrostatically shield the semiconductor element 4 from other elements. As a consequence, it is possible to highly effectively prevent the noise from being entered from the outer portion of the semiconductor device into the semiconductor element 4. Also, it is possible to highly effectively prevent the noise produced within the semiconductor element 4 from being irradiated outside this semiconductor element 4, resulting in improvements of the electrostatic shield effects.

Moreover, a large electrostatic capacitance straying between the reinforcement plate 25 and the heat sink 27 is added to the stray capacitance defined between the power supply line and the ground line, the stray capacitance between the power supply and the ground is extremely increased. As a result, even when a potential variation occurs in either the power supply line or the ground line and thus noise is produced, this noise may be absorbed by presence of such a large stray capacitance, so that the noise can be hardly produced. Assuming now that the noise occurs, this noise becomes low. As a result, the noise withstanding characteristic of the semiconductor device is increased.

It should be noted that in the semiconductor device shown in FIG. 3, the reinforcement plate 25 is connected to the power supply line, and the heat sink 27 is connected to the ground line. Conversely, the reinforcement plate 25 may be connected to the ground line, whereas the heat sink 27 may be connected to the power supply line. There is no large difference in the effects achieved by the embodiment case, and the alternative case.

FIG. 4A to FIG. 4I are sectional views for indicating sequential steps for forming the film circuit and also for adhering the reinforcement plate.

Figure 4A:
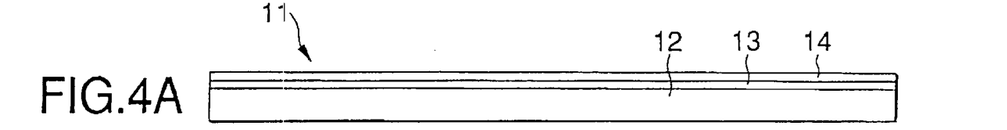

First, as indicated in FIG. 4A, a metal stacked layer plate 11 having a three layer structure is prepared. This stacked layer plate 11 is made by stacking a copper layer 12 having a thickness of, for example, 150 $\mu$m; an aluminum layer 13 having a thickness of 3 $\mu$m, which plays a role as an etching stopper; and a plating underlayer 14 having a thickness of 2 $\mu$m and made of either copper or nickel. It should be understood that the plating underlayer 14 may be made of such a multilayer structure that, for instance, a nickel layer (thickness being, e.g., 2 $\mu$m) is formed on a chrome layer (thickness being, e.g., 0.2 $\mu$m).

Figure 4B:
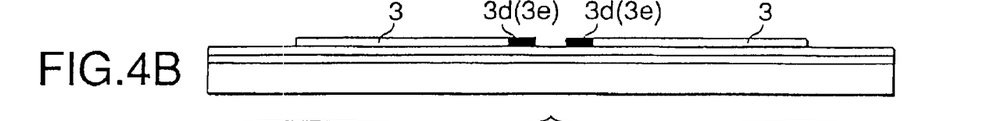

Next, as indicated in FIG. 4B, the wiring films (leads) 3, 3d, 3e are formed on the plating underlayer 14. Concretely speaking, resist of negative patterns is coated with respect to patterns used to form these wiring films 3, 3d, 3e. While this resist is used as a mask, the underlayer 14 is plated by using copper (otherwise nickel) and the plating thickness is selected to be, for example, 30 $\mu$m. When this forming method is carried out, since there is no side etching, very fine loads can be manufactured in high precision.

On the other hand, the important factor to form these wiring films 3, 3d, 3e is such that the wiring films 3d and 3e should be double-bonded (namely, wiring films are bonded to electrodes of semiconductor element, and wiring films are bonded to either reinforcement plate or conductive ring). As a consequence, lengths of these wiring films 3d and 3e which are projected to the inside must be made longer than that of the remaining wiring film 3. In FIG. 4, a portion indicated by the inclined lattice of the lead is an inner edge portion of the wiring film 3d which constitutes the power supply line. This power supply line can be observed being sticking from the normal wiring film 3. It should be noted that since the wiring film 3e which constitutes the ground line is hidden from the above wiring film 3d, this wiring film 3e does not appear in FIG. 4.

Figure 4C:
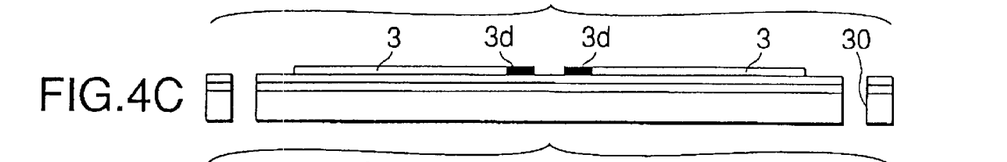

Next, as indicated in FIG. 4C, a lead frame shape to which a plurality of film circuits are integrally coupled is formed by selectively etching both surfaces of the metal stacked layer plate 11 in such a manner that this etching process may penetrate through this metal stacked layer plate 11. This etching process is carried out by employing, for example, an etching fluid of ferric chloride. Reference number 30 shows an outer hole formed by the etching process.

Next, an insulating layer (insulating film) 2 is selectively formed on a surface of the above-described stacked layer plate 11 on the side of a lead forming surface thereof. This insulating layer 2 is formed in a desirable pattern in such a manner that while a resin material having a photosensitivity characteristic is used, this photosensitive resin material is coated, exposed, and then developed. Reference numerals 21, 21, . . . are openings used to expose such a portion where the ball electrodes 6 of the respective wiring films 3, 3d, 3e of the insulating layer 2 are formed. The insulating layer 2 is selectively formed so as to have these openings 21, 21, . . . As a result, it is not required that the insulating layer 2 is patterned by way of, for example, the laser process.

Figure 4D:
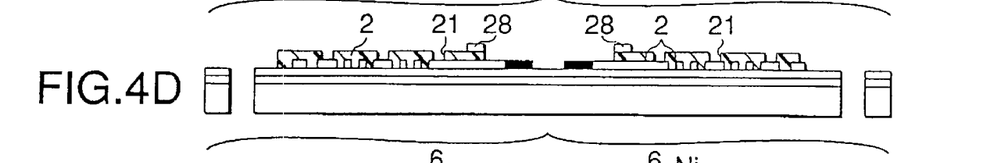

Thereafter, a ring-shaped dam 28 made of a resin film is formed. Concretely speaking, this dam 28 plays a role to dam that sealing resin is overflown out from the wiring films 3, 3d, 3e in the case that after the respective electrodes of the semiconductor element 4 are bonded on the inner edges of the wiring films 3, 3d, 3e of the film 1, these wiring films and the electrodes are sealed by using resin (not shown). However, this dam 28 is not necessarily required. FIG. 4D indicates such a condition that the dam 28 has been formed.

Figure 4E:
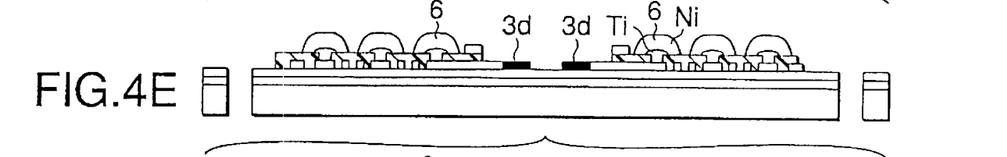

Next, as indicated in FIG. 4E, while the insulating layer 2 is used as a mask, the soldering balls 6, 6, . . . , which constitute external terminals are formed on the surfaces of the wiring films 3, 3d, 3e. The soldering balls 6, 6, . . . , are formed by way of the nickel plating process (thickness is selected to be, for example, 80 to 110 $\mu$m), and either the soldering process or the gold plating process (thickness is selected to be, for example, 10 to 30 $\mu$m).

Figure 4F:
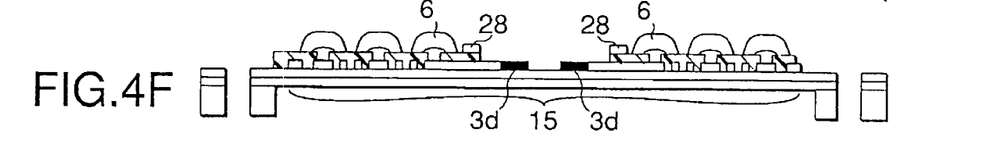

Next, as shown in FIG. 4F, a portion corresponding to a major portion 15 of the film circuit 1 of the thick copper layer 12 located on the rear side of the stacked layer 11 is removed by way of the selective etching from the rear side. This selective etching process is carried out by employing an etching fluid of, for example, $H_2SO_4/H_2O_2$. The reason why such an etching fluid is employed is given as follows: This etching fluid may etch away copper, but may not etch away aluminum, and thus can cause the aluminum layer 13 to play a role as an etching stopper.

Figure 4G:
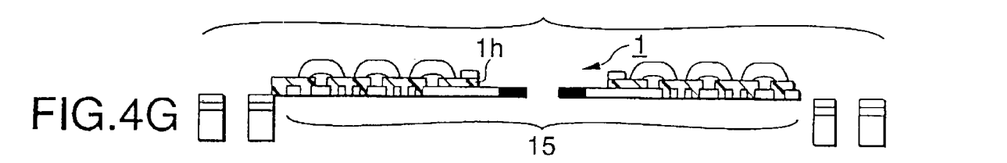

Next, as shown in FIG. 4G, while the above-explained wiring layers 3, 3d, 3e are used as a mask, both the plating underlayer 14 which constitutes an underlayer of these wiring films, and also the aluminum layer 13 which has constituted the etching stopper are etched away. As a result, the respective wiring films 3, 3d, and 3e are independently provided, and are brought into such a condition that these wiring films are not electrically shortcircuited with each other.

Figure 4H:
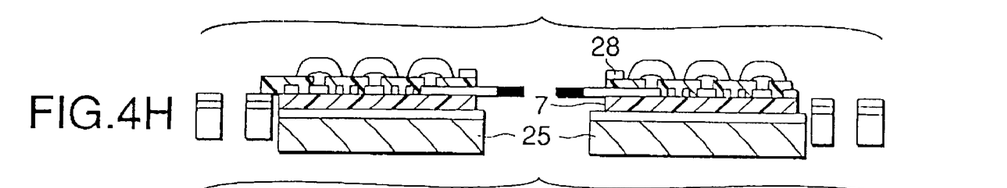

Next, as indicated in FIG. 4H, a rectangular ring-shaped reinforcement plate 25 is adhered to a rear surface of the major portion of the film circuit 1 via adhesive agent 7 having a cushion characteristic. In this case, there is an important factor for the reinforcement plate 25. That is, an inner peripheral portion of this reinforcement plate 25 is smaller than an inner peripheral portion (device hole) of the film circuit 1, and when the film circuit 1 is overlapped over the reinforcement plate 25, the inner peripheral portion of the reinforcement plate 25 is sticking into the device hole 1h of the film circuit 1. This is because the portion deviated from the inner edge of the wiring film 3d which constitutes the power supply line can be bonded to the reinforcement plate 25.

Figure 4I:
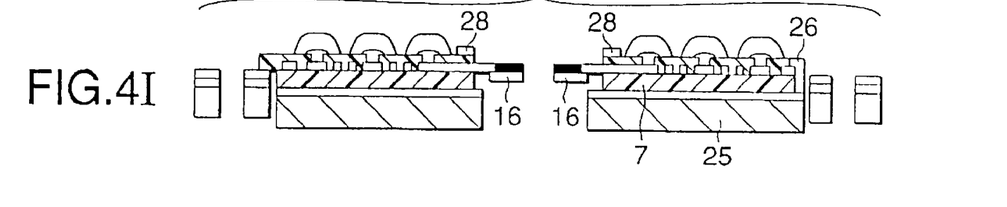

Next, as indicated in FIG. 4I, bumps 16, 16, . . . , are formed on the edge portions of the respective wiring films 3, 3d, and 3e. It should be understood that these bumps may be formed on the side of the semiconductor element 4, otherwise none of these bumps is formed thereon.

In this embodiment mode, the lead 3 is formed in such a manner that while the resist film selectively formed on the plating underlayer film is used as the mask, the plated film is grown. Alternatively, while the layer 14 made of either copper or nickel is made thicker, the lead may be formed by patterning this layer by way of the selective etching process.

Next, referring now to FIG. 5A to FIG. 5C, a description will be made of sequential steps for assembling the semiconductor element to the film circuit equipped with the reinforcement plate, and also for assembling a conductive ring and the heat sink.

Figure 5A:
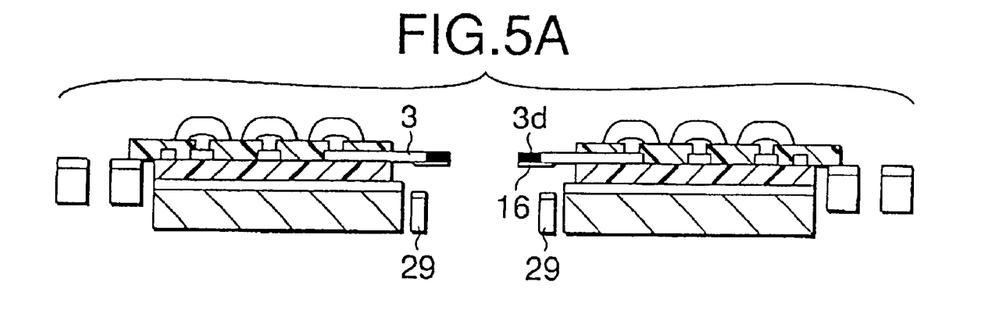

As indicated in FIG. 5A, a conductive ring 29 is positioned within the rectangular ring-shaped reinforcement plate 25. This conductive ring 29 is surface-processed in order that the bumps can be fastened to this conductive ring 29.

Figure 5B:
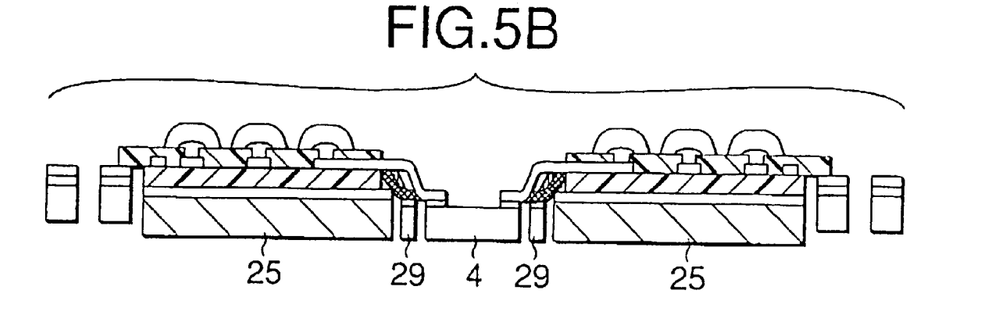

Subsequently, as shown in FIG. 5B, the bumps 16, 16, . . . , of the tip portions of the respective wiring films 3, 3d, 3e are connected to the electrode pads 5, 5, . . . , of the semiconductor element 4 by way of the single point bonding. In connection with this single point bonding, as to the wiring film 3d which constitutes the power supply line, after the tip portion of this wiring film 3d has been bonded to the electrode pads 5 which constitute the power supply terminal of the semiconductor element 4, a portion which is slightly separated from the tip portion is also bonded on the upper surface of the reinforcement plate 25. Further, as to the wiring film 3e which constitutes the ground line, after the tip portion of this wiring film 3e has been bonded to the electrode pads 5 which constitute the ground terminal of the semiconductor element 4, a portion which is slightly separated from the tip portion is also bonded on the upper surface of the conductive ring 29. Alternatively, it is of course possible to connect the wiring film 3d to the conductive ring 29, and also to connect the wiring film 3e to the reinforcement plate 25.

Figure 5C:
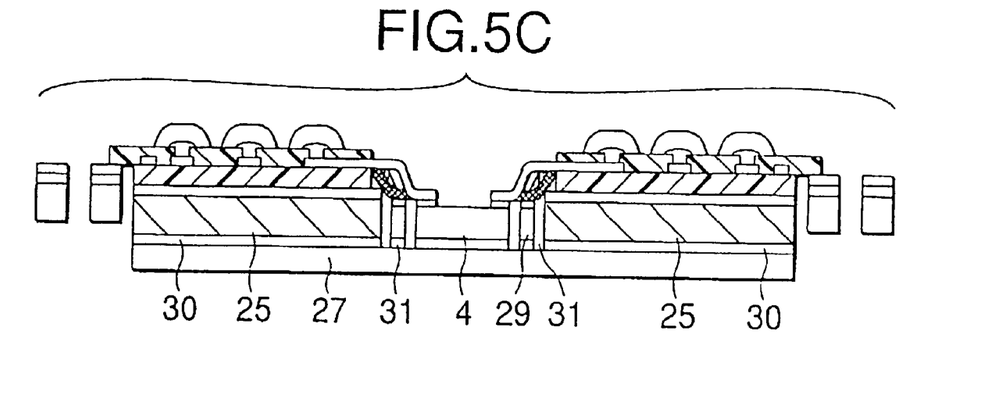

Next, as shown in FIG. 5C, the heat sink 27 is adhered to the semiconductor element 4, the reinforcement plate 25, and the rear surface of the conductive ring 29. In this case, there is such an important factor that the reinforcement plate 25 is adhered to the heat sink 27 by using insulating adhesive agent 30, whereas the conductive ring 29 is adhered to the heat sink 27 by employing conductive adhesive agent 31. Then, the stray capacitance between the reinforcement plate 25 and the heat sink 27, and thus the stray capacitance between the power supply terminal and the ground terminal can be controlled based upon the material (dielectric constant) of the insulating adhesive agent 30, or the thickness of this insulating adhesive agent 30.

Thereafter, the shapes of the soldering electrodes 6, 6, . . . , which constitute external terminals are shaped in dome shapes by way of the reflow fusing. Subsequently, these soldering electrodes 6, 6, . . . , are sealed by resin. Next, an unnecessary portion of the lead-frame-shaped metal stacked layer body 11 is cut away, and the respective film circuits 1 are independently separated from each other. As a result, the semiconductor device according to the present invention as shown in FIG. 3 can be manufactured (note that indication of resin is omitted in FIG. 3).

Figure 6:
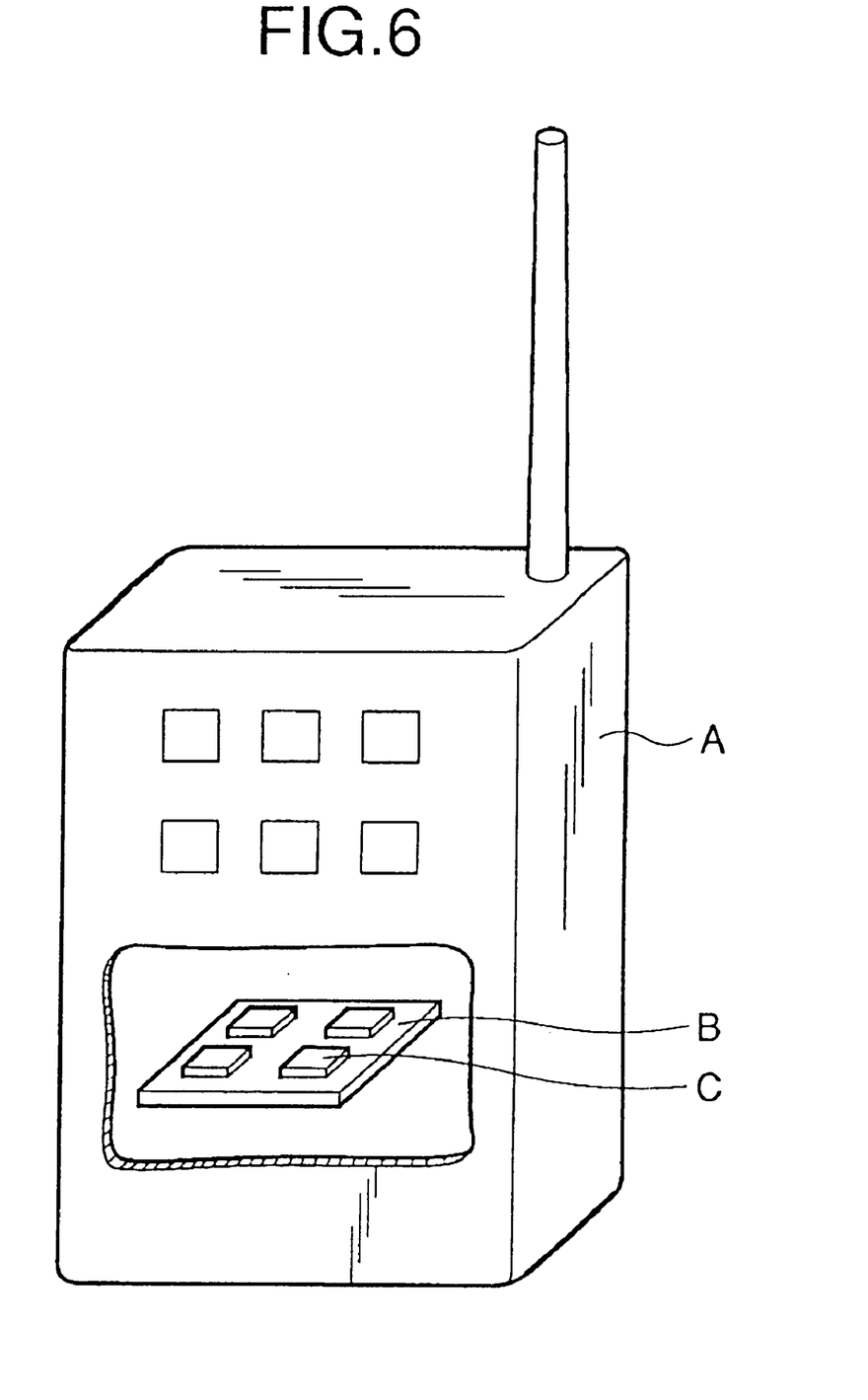
FIG. 6 is a perspective view for showing one example of an electronic appliance, a portion of which is cut out, with employment of the semiconductor device of the present invention.

The above-described semiconductor device indicated in FIG. 3 may be employed in each of electronic appliances. In particular, when this semiconductor device is used in, for example, a portable telephone and the like which require noise withstanding characteristics, such a low noise merit owned by the semiconductor device can be effectively realized. FIG. 6 represents an example A of such an electronic appliance (portable telephone). In this electronic appliance, a semiconductor device C according to the present invention is present which is mounted on a mother board B, and this semiconductor device C constitutes at least a portion of the internal circuit of this electronic appliance.

In accordance with the semiconductor device of the first aspect, the ground terminal is connected to one of the conductive reinforcement plate and the conductive heat sink, and the power supply terminal is connected to the other of the conductive reinforcement plate and the conductive heat sink. As a consequence, the electrostatic capacitance straying between the reinforcement plate and the heat sink may stray between the power supply and the ground. As a result, the stray capacitance existing between the power supply and the ground can be increased. Therefore, the noise can be effectively eliminated by such a large stray capacitance, and thus the noise withstanding characteristic of the semiconductor device can be increased.

In accordance with the method for manufacturing the semiconductor device of the second aspect, both the power supply terminal and the ground terminal of the wiring films of the film circuit are connected not only to the electrodes of the semiconductor element, but also to either the reinforcement plate or the heat sink (double-bonding). As a consequence, such a capacitance straying between the reinforcement plate and the heat sink can be located between the power supply terminal and the ground terminal.

In accordance with the electronic appliance of the third aspect, since such a semiconductor device having the large stray capacitance between the power supply and the ground is employed and this stray capacitance is capable of effectively absorbing the noise, the noise can be further reduced.

What is claimed is:

1. A semiconductor device, comprising:
   a heat sink;
   a semiconductor element secured on said heat sink, said semiconductor element having a plurality of electrodes;
   a reinforcement plate adhered to said heat sink, said reinforcement plate having an inner portion surrounding said semiconductor element; and
   a film circuit positioned on said reinforcement plate, said film circuit configured so as to not overlay said inner portion, said film circuit having a plurality of wiring films and an insulating layer, said plurality of wiring films being formed on a rear surface of said insulating layer facing toward said reinforcement plate, each of said plurality of wiring films having a first end electrically connected to a respective one of said plurality of electrodes and a second end being an external terminal, said film circuit including a ground terminal and a power supply terminal; a conductive ring positioned between said reinforcement plate and said semiconductor element, said conductive ring being adhered to said heat sink via a conductive agent;
   wherein,
     said reinforcement plate and said heat sink are electrically conductive;
     said ground terminal being electrically connected to one of said reinforcement plate and said heat sink; and
     said power supply terminal being electrically connected to the other of said reinforcement plate and said heat sink.

2. The semiconductor device of claim 1, further comprising:
   a conductive ring positioned between said reinforcement plate and said semiconductor element, said conductive ring being adhered to said heat sink via a conductive agent.

3. The semiconductor device of claim 1, further comprising:
- a conductive ring positioned between said reinforcement plate and said semiconductor element, said conductive ring being electrically connected to said heat sink and said heat sink being electrically connected to one of said ground terminal and said power supply terminal via said conductive ring.

4. An electronic appliance comprising:
- a heat sink;
- a semiconductor element secured on said heat sink, said semiconductor element having a plurality of electrodes;
- a reinforcement plate adhered to said heat sink, said reinforcement plate having an inner portion surrounding said semiconductor element; and
- a film circuit positioned on said reinforcement plate, said film circuit configured so as to not overlay said inner portion, said film circuit having a plurality of wiring films and an insulating layer, said plurality of wiring films being formed on a rear surface of said insulating layer facing toward said reinforcement plate, each of said plurality of wiring films having a first end electrically connected to a respective one of said plurality of electrodes and a second end being an external terminal, said film circuit including a ground terminal and a power supply terminal; a conductive ring positioned between said reinforcement plate and said semiconductor element, said conductive ring being adhered to said heat sink via a conductive agent;

wherein,
- said reinforcement plate and said heat sink are electrically conductive;
- said ground terminal being electrically connected to one of said reinforcement plate and said heat sink;
- said power supply terminal being electrically connected to the other of said reinforcement plate and said heat sink;
- said heat sink, said reinforcement plate said film circuit and said semiconductor element are sealed together by a resin.

5. The electronic appliance of claim 4, further comprising:
- a conductive ring positioned between said reinforcement plate and said semiconductor element, said conductive ring being electrically connected to said heat sink, said heat sink being electrically connected to one of said ground terminal and said power supply terminal via said conductive ring.

* * * * *